United States Patent [19]

Levine et al.

[11] Patent Number: 4,611,746
[45] Date of Patent: Sep. 16, 1986

[54] PROCESS FOR FORMING IMPROVED SOLDER CONNECTIONS FOR SEMICONDUCTOR DEVICES WITH ENHANCED FATIGUE LIFE

[75] Inventors: Ernest N. Levine; Lewis D. Lipschutz, both of Poughkeepsie; Horatio Quinones, Peekskill, all of N.Y.

[73] Assignee: International Business Machines Corporation, Armonk, N.Y.

[21] Appl. No.: 625,386

[22] Filed: Jun. 28, 1984

[51] Int. Cl.⁴ .............................................. B23K 1/00
[52] U.S. Cl. .................................... 228/123; 228/122; 228/124; 228/180.2; 228/231
[58] Field of Search ............ 228/122, 123, 124, 180.2, 228/231

[56] References Cited

U.S. PATENT DOCUMENTS 3,273,979 9/1966 Budnick .............................. 228/122
3,429,040 2/1969 Miller .................................. 228/215

FOREIGN PATENT DOCUMENTS 0092041 2/1983 European Pat. Off. .
1022165 3/1966 United Kingdom .

Primary Examiner—Nicholas P. Godici
Assistant Examiner—Karen Skillman
Attorney, Agent, or Firm—Wolmar J. Stoffel

[57] ABSTRACT

In accordance with the present invention, we provide a new method for relieving stresses in the device-substrate interconnection structure which greatly enhances the resistance of the interconnection solder bonds to fatigue failure. In accordance with the aforementioned object of the process of our invention for forming improved solder interconnections between integrated circuit semiconductor devices and the supporting substrate, the process includes the step of joining the device I/O pads to the corresponding I/O pads of the substrate by positioning the device over the substrate with solder material selectively positioned between the respective I/O pads, heating the assembly to at least the melting point of the solder material, and cooling to solidify the solder. Subsequently, the resultant device-substrate is annealed by heating to an annealing temperature in the range of 115° to 135° C. and maintaining this temperature for a time in excess of 2 days.

6 Claims, 5 Drawing Figures

PROCESS FOR FORMING IMPROVED SOLDER CONNECTIONS FOR SEMICONDUCTOR DEVICES WITH ENHANCED FATIGUE LIFE

TECHNICAL FIELD

This invention relates to methods of solder joining a microminiaturized component to a supporting board or substrate, and more particularly to a method of forming solder interconnections between a semiconductor device and a substrate with different coefficient of expansion than the device.

The present invention involves the face-down or flip-chip bonding of a semiconductor device to a substrate wherein a plurality of electrical connections between the device and the supporting board or substrate are formed by very small, closely spaced solder interconnections. The present invention is an improvement in the solder reflow controlled collapse, chip connection (C-4) technology. The U.S. Pat. Nos. 3,401,126 and 3,429,040 to Lewis F. Miller and assigned to the assignee of the present patent application describe in detail the basic controlled collapse chip connection technique of face-down bonding of semiconductor chips to a carrier. In general, what is described and claimed in these patents is the formation of maleable pads of metallic solder on the semiconductor chip contact site and solder joinable sites on the conductors of the chip's carrier. The chip carrier solder joinable sites are surrounded by non-solderable barriers so that when the solder on the carrier sites and semiconductor device contact sites melt and merge, surface tension holds the semiconductor chip suspended above the carrier.

With the development of the integrated circuit semiconductor device technology, the size of individual active and passive elements have become very small, and the number of elements in a device has increased dramatically. This resulted in significantly larger device sizes with larger numbers of I/0 terminals. This trend will continue and place increasingly higher demands on terminal density and overall numbers. An advantage of solder joining (C-4) is that I/0 terminals can be distributed over substantially the entire top surface of the semiconductor device. This allows an efficient use of the entire surface, which is more commonly known as area bonding.

Normally, the integrated circuit semiconductor devices are mounted on supporting substrates made of materials with coefficients of expansion that differ from the coefficient of expansion of the material of the semiconductor device, i.e. silicon. In use, the elements of the semiconductor device inevitably generate heat resulting in temperature fluctuations in both the device and the supporting substrate since the heat is conducted through the solder interconnections. The device and the substrate expand and contract in different amounts with temperature fluctuations, due to the difference in coefficients of expansion. This imposes stresses on the solder terminals.

The need to improve the reliability of solder interconnections in the semiconductor technology is urgent. Of prime concern is improving the resistance of the interconnections to fatigue failure. The stress on the solder bonds due to this factor is increased by utilizing larger device sizes and smaller and more closely spaced connections. While relief in the future is promised when ceramic materials are developed with coefficients of expansion that match silicon, this may take place in the more distant future leaving an acute interim need.

DISCLOSURE OF THE INVENTION

In accordance with the present invention, we provide a new method for relieving stresses in the device-substrate interconnection structure which greatly enhances the resistance of the interconnection solder bonds to fatigue failure.

In accordance with the aforementioned object of the process of our invention for forming improved solder interconnections between integrated circuit semiconductor devices and the supporting substrate, the process includes the step of joining the device I/0 pads to the corresponding I/0 pads of the substrate by positioning the device over the substrate with solder material selectively positioned between the respective I/0 pads, heating the assembly to at least the melting point of the solder material, and cooling to solidify the solder. Subsequently, the resultant device-substrate is annealed by heating to an annealing temperature in the range of 115° to 135° C. and maintaining this temperature for a time in excess of 2 days.

BRIEF DESCRIPTION OF THE DRAWINGS

The details of our invention will be described in connection with the accompanying drawings in which.

DETAILED DESCRIPTION OF THE INVENTION

Figure 1:
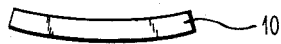
FIGS. 1 through 4 depict elevational views in cross section of a device in various stages of joining which illustrates the theory associated with the annealing treatment of our invention.

In order to better appreciate the process and result of using the process of our invention, it will be useful to explore the theory underlying the invention. As is well known in the art, an integrated circuit semiconductor device is a relatively complex laminated structure made up of a number of different materials having different physical characteristics. The device typically has a base substrate of monocrystalline silicon with a plurality of layers of $SiO_2$, and/or $Si_3N_4$, or other dielectric layers or combinations thereof bonded to only one side, with a network of aluminum metallurgy stripes sandwiched between the layers. Further. in dielectric isolation applications, there may be $SiO_2$ filled trenches provided on one side of the substrate. The end result is basically a laminated structure with a thin bonded skin of material only on one side that has a different coefficient of expansion from the basic substrate material. We have discovered that this complex structure assumes a bowed configuration at room temperature that has a concave surface when viewed from the back, or top, side opposite the side containing the devices. This configuration results when the device is cooled down after the layers have been deposited at relatively high temperatures. The structure is somewhat analogous to a bi-metallic strip of metal. The shape of the device at room temperature in an unconstrained condition is illustrated in FIG. 1 which shows the curvature of device 10 greatly exaggerated.

Figure 2:
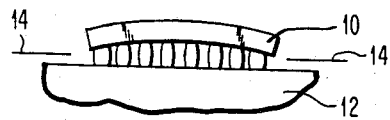
Figure 3:

When the device 10 is connected to a substrate 12 by solder bonding terminals, in the manner well known in the art as described in U.S. Pat. Nos. 3,401,126 and 3,429,040, and the substrate is of a material with a coefficient of expansion greater than the coefficient of expansion of silicon, the device 10 assumes the shape shown in FIG. 2. Again, the shape depicted is greatly exaggerated for illustrative purposes. In general, the shape of the joined device 10 is changed from the shape shown in FIG. 1. in its free state. The device 10 may appear convex as illustrated in FIG. 2, or be planar, or possibly even concave, but less concave than in the unconstrained, relaxed condition. Putting it another way, when a joined chip is removed from a substrate it is found to be more concave than it was in the joined state—as viewed from the unbonded side of the chip. There are two mechanisms, both of which cause a joined chip to be held in a more convex shape than its free-state-shape: Based on calculations, we believe the primary mechanism to be the differential expansion between the silicon chip and the substrate to which it is joined, the substrate having a larger coefficient of thermal expansion than the chip. As both chip and substrate cool from the chip joining temperature the substrate will contract more than the chip and exert inwardly-directed forces on the underside of the chip, indicated by arrows 14 tending to make it more convex as shown in FIG. 2. The other mechanism is differential expansion between the silicon chip and the aluminum and quartz layers deposited on the bottom side of it. As the chip cools from the joining temperature the net motion of the chip, if free, would be to go more concave, however, it is kept from doing so by the solder bonds.

The fact that the joined chip is held in a more convex shape than its free shape means that outer terminals must be in tension. This tension has two adverse effects on the life of the outermost terminals under repeated temperature fluctuations: For one, the tensile stress is superimposed on the cyclic shear and thereby causes more fatigue deterioration. For another, fatigue cracks in the solder bonds which might otherwise remain narrow are opened up by the tensile stress and become less likely to conduct current. The fatigue cracks in the solder terminals are most likely to occur in the outer terminals.

Figure 4:

This invention involves the recognition of the aforedescribed phenomena and a process for allowing a semiconductor device, as joined, to assume a more relaxed or unconstrained shape that is relatively free of stress. The invention consists of an annealing step that permits the solder bonds on the device as joined to deform, allowing the device to assume a relatively unstressed condition relieving at least in part the tensile stress without simultaneously subjecting the bonds to damaging fatigue stresses. The process basically changes the solder interconnection bonds allowing them to deform and allow the integrated circuit device to assume a shape approximating the shape it would assume if it were unstressed and thereby relieve the tension and stresses in the solder bonds which will in turn increase the fatigue life of the interconnections. FIG. 4 depicts a device 10 mounted on a substrate 12 that has been annealed in accordance with the process of the invention.

Figure 5:
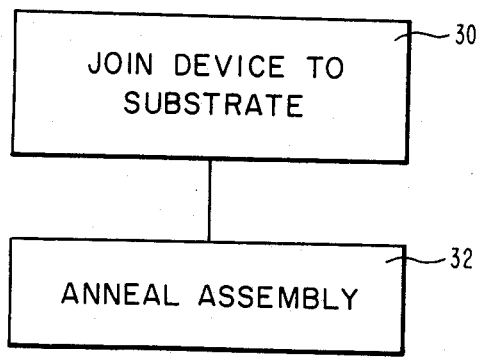
FIG. 5 is a flow chart depicting the steps of the device joining process of our invention.

The process of this invention for forming an improved solder interconnection between an integrated circuit semiconductor device and a supporting substrate comprised of a material having the coefficient of expansion that differs from the coefficient of expansion of the material of the device involves first joining the device to the substrate using conventional solder bonding techniques i.e., positioning the device over the substrate with the solder material selectively positioned between the respective I/0 pads, the device and the substrate and heating the assembly to at least the melting point of the solder material and then cooling to solidify the solder interconnection. This step is indicated in block 30 of FIG. 5. Subsequently, the resultant device and substrate assembly is annealed by heating it to an annealing temperature for a time sufficient to allow the solder interconnection bond to deform and allow the device to assume its relatively unconstrained shape. The annealing step is achieved by heating the assembly to a temperature in the range of 115° to 135° C. for a time in excess of 2 days. More preferably, the heating is done for a time in the range of 6 to 10 days. Still more preferably, the annealing temperature is of the order of 125° C. and the annealing time is of the order of 10 days. The annealing can be done in air or in an inert atmosphere. The annealing step is indicated in block 32 of FIG. 5. Modifications can be made to the process by annealing the resultant device in a suitable inert fluid at the desired temperature normally from 115° to 135° C. for the required time.

The following example is presented to illustrate and teach the practice of the method of the invention, and to indicate the degree of beneficial results that can be achieved thereby.

EXAMPLE

Two identical sets of test specimens were prepared, wherein each test specimen consisted of an integrated semiconductor device joined to a ceramic substrate. The device was formed of Si and had a 17×17 solder pad array with the pad spacing having a center-to-center spacing of 10 mils. The distance between the neutral point i.e. the center of the array, and the corner pads was 111.36 mils. The coefficient of expansion of Si is $2.5 \times 10_{-6}$ per °C. The average curvature of the unconstrained devices was determined to be $3.1 \times 10_{-3}$ per inch. The substrate was a multi-layer ceramic type substrate formed of alumina with a coefficient of expansion of $5.8 \times 10^{-6}$ per °C. The substrates each had a 17×17 pad array on the top surface which corresponded to the pad array on the devices. After the devices were joined to the substrate by conventional solder reflow techniques, the average curvature of the constrained devices was determined to be $1.5 \times 10_{-3}$ per inch. The first set of specimens were placed in an oven in an air environment and heated at 125° C. for 10 days. After this anneal step, the average curvature of the semiconductor devices was determined to be $2.9 \times 10_{-3}$ per inch. Both sets of specimens were than thermal cycled while being monitored until at least one of the solder interconnections between the device and substrate failed. The thermal cycling involved varying the temperature of specimens from 0° C. to 100° C. in a chamber 48 times per day. As each specimen failure occurred the number of thermal cycles necessary for causing the failure was recorded. At the termination of the experiment the results were calculated and the condition of the specimens noted. It was found that for unannealed specimens, 0.6% cumulative fraction fail occurred at about 1250 thermal cycles and the corresponding number of cycles for annealed specimens was approximately 4000 cycles. It is apparent that the annealing treatment had produced a very beneficial result by significantly prolonging the life of solder bond interconnections used to bond elements formed of materials with different coefficients of expansion.

While the invention has been illustrated and described with reference to preferred embodiments thereof, it is to be understood that the invention is not limited to the precise construction herein disclosed and the right is reserved to all changes and modifications coming within the scope of the invention as defined in the appended claims.

We claim:

1. A process for forming an improved solder interconnection between an integrated semiconductor device and a supporting substrate, of a material that has a coefficient of expansion that differs from the coefficient of expansion of the material of the device comprising joining the device I/O's to the corresponding I/O's of the substrate by positioning the device over the substrate with solder material selectively positioned between the respective I/0 pads, heating the assembly to at least the melting point of the solder material, and cooling to solidify the solder, subsequently annealing the resultant device and substrate assembly by heating to an annealing temperature in the range of 115° to 135° C. and maintaining it for a time in excess of 2 days.

2. The process of claim 1 wherein said annealing is done in air environment.

3. The process of claim 1 wherein the annealing temperature is maintained for a total time in the range of 6 to 10 days.

4. The process of claim 1 wherein the device is formed of silicon, and the substrate is formed primarily of alumina.

5. The process of claim 4 wherein the annealing temperature is of the order of 125° C. and the total annealing time is of the order of 10 days.

6. A process for forming an improved solder interconnection between an integrated semiconductor device and a supporting substrate, of a material that has a coefficient of expansion that differs from the coefficient of expansion of the material of the device comprising joining the device I/O's to the corresponding I/O's of the substrate by positioning the device over the substrate with solder material selectively positioned between the respective I/0 pads, heating the assembly to at least the melting point of the solder material, and cooling to solidify the solder, subsequently annealing the resultant device and substrate assembly by heating to an annealing temperature in the range of 85° to 175° C. and maintaining it for a time in excess of 1 day.

* * * * *

UNITED STATES PATENT AND TRADEMARK OFFICE
CERTIFICATE OF CORRECTION

PATENT NO. : 4,611,746
DATED : September 16, 1986
INVENTOR(S) : Ernest N. Levine, Lewis D. Lipschutz, Horatio Quinones It is certified that error appears in the above-indentified patent and that said Letters Patent is hereby corrected as shown below:

On the title page, the last inventor should read;
    Horatio Quinones, Wappingers Falls, New York Signed and Sealed this Twenty-eighth Day of July, 1998

*Attest:*

BRUCE LEHMAN

*Attesting Officer*      *Commissioner of Patents and Trademarks*